(12) United States Patent
Kim et al.

(10) Patent No.: US 10,230,062 B2
(45) Date of Patent: Mar. 12, 2019

(54) DISPLAY DEVICE

(71) Applicant: SAMSUNG DISPLAY CO., LTD., Yongin-si, Gyeonggi-do (KR)

(72) Inventors: Youn Joon Kim, Yongin-si (KR); Se Bong Kim, Yongin-si (KR); Gyeong Ho Jeong, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/635,678

(22) Filed: Jun. 28, 2017

(65) Prior Publication Data

US 2018/0013080 A1    Jan. 11, 2018

(30) Foreign Application Priority Data

Jul. 7, 2016 (KR) .................. 10-2016-0086161

(51) Int. Cl.
*H01L 51/00* (2006.01)
*H01L 51/52* (2006.01)
*H01L 27/32* (2006.01)

(52) U.S. Cl.
CPC ...... *H01L 51/0097* (2013.01); *H01L 27/3272* (2013.01); *H01L 51/529* (2013.01); *H01L 51/5246* (2013.01)

(58) Field of Classification Search
CPC .............. H01L 51/0097; H01L 51/529; H01L 27/3272; H01L 51/5246
USPC .......................................................... 257/88
See application file for complete search history.

(56) References Cited

U.S. PATENT DOCUMENTS

| 9,343,802 | B2 | 5/2016 | Su et al. |
| 2016/0064685 | A1 | 3/2016 | Kim |
| 2017/0170206 | A1* | 6/2017 | Lee ..................... H01L 27/1218 |
| 2017/0194411 | A1* | 7/2017 | Park ..................... H01L 27/3276 |

FOREIGN PATENT DOCUMENTS

| KR | 10-2012-0067506 A | 6/2012 |
| KR | 10-2014-0113017 A | 9/2014 |
| KR | 10-2016-0025152 A | 3/2016 |

* cited by examiner

*Primary Examiner* — Caleen Sullivan
(74) *Attorney, Agent, or Firm* — Lee & Morse, P.C.

(57) ABSTRACT

A display device including a display panel that displays an image at a first surface thereof; a first member on a second surface of the display panel, the first member having a first density; and a second member between the display panel and the first member, the second member having a second density that is less than the first density.

23 Claims, 13 Drawing Sheets

DISPLAY DEVICE

CROSS-REFERENCE TO RELATED APPLICATION

Korean Patent Application No. 10-2016-0086161, filed on Jul. 7, 2016, in the Korean Intellectual Property Office, and entitled: "Display Device," is incorporated by reference herein in its entirety.

BACKGROUND

1. Field

Embodiments relate to a display device.

2. Description of the Related Art

Various display devices have recently been developed, and an organic light emitting display device is one of representative display device.

The organic light emitting device may include two electrodes and an organic light emitting layer interposed between the two electrodes. Electrons injected from one electrode and holes injected from the other electrode may be combined in the organic light emitting layer so as to form excitons, and the excitons emit light through energy emission.

SUMMARY

The embodiments may be realized by providing a display device including a display panel that displays an image at a first surface thereof; a first member on a second surface of the display panel, the first member having a first density; and a second member between the display panel and the first member, the second member having a second density that is less than the first density.

The first member and the second member may be buffer members that buffer impact applied to the display panel.

The first density may be about 0.7 g/cm$^3$ to about 0.9 g/cm$^3$, and the second density may be about 0.3 g/cm$^3$ to about 0.5 g/cm$^3$.

The first member may have a thickness of about 60 μm to about 150 μm, and the second member may have a thickness of about 60 μm to about 150 μm.

Each of the first member and the second member may have a thickness of about 100 μm.

The first member and the second member may be made of a foam.

Each of the first member and the second member may independently include polystyrene, a polyolefin, a polyurethane, a polyamide, a synthetic rubber, polydimethylsiloxane, polybutadiene, polyisobutylene, poly(styrene-butadiene-styrene), polychloroprene, polyethylene, silicone, or a combination thereof.

The display device may further include a support film between the first member and the second member.

The support film may have a thickness of about 30 μm or less.

The display device may further include an adhesive layer between the first member and the second member.

The display panel may include a foldable area in which the display panel is foldable, and a rigid area at one or more sides of the foldable area.

At least one of the first member and the second member may have a variable thickness such that the thickness is different at different locations of the member.

At least one of the first member and the second member may have a thickness in the foldable area that is smaller than a thickness thereof in the rigid area.

At least one of the first member and the second member may have a variable density such that the density is different at different locations of the member.

At least one of the first member and the second member may be provided in plurality.

The display device may further include a third member between the second member and the display panel.

The display panel, the first member, and the second member may have flexibility.

The display device may further include a light shielding layer between the display panel and the second member.

The display device may further include a heat dissipation layer on an outer surface of the first member.

The display device may further include an electromagnetic wave shielding layer on an outer surface of the heat dissipation layer.

The embodiments may be realized by providing a display device including a display panel that displays an image at a surface thereof; a bending deformation buffer layer on another surface of the display panel; and a compression and tensile deformation buffer layer between the display panel and the bending deformation buffer layer, the bending deformation buffer layer being different from the compression and tensile deformation buffer layer.

The bending deformation buffer layer may have a density that is greater than a density of the compression and tensile deformation buffer layer.

The bending deformation buffer layer may have a density of about 0.7 g/cm$^3$ to about 0.9 g/cm$^3$, and the compression and tensile deformation buffer layer may have a density of about 0.3 g/cm$^3$ to about 0.7 g/cm$^3$.

The bending deformation buffer layer and the compression and tensile deformation buffer layer may each independently include polystyrene, a polyolefin, a polyurethane, a polyamide, a synthetic rubber, polydimethylsiloxane, polybutadiene, polyisobutylene, poly(styrene-butadiene-styrene), polychloroprene, polyethylene, silicone, or a combination thereof.

The display panel may include a foldable area in which the display panel is foldable, and a rigid area at one or more sides of the foldable area.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
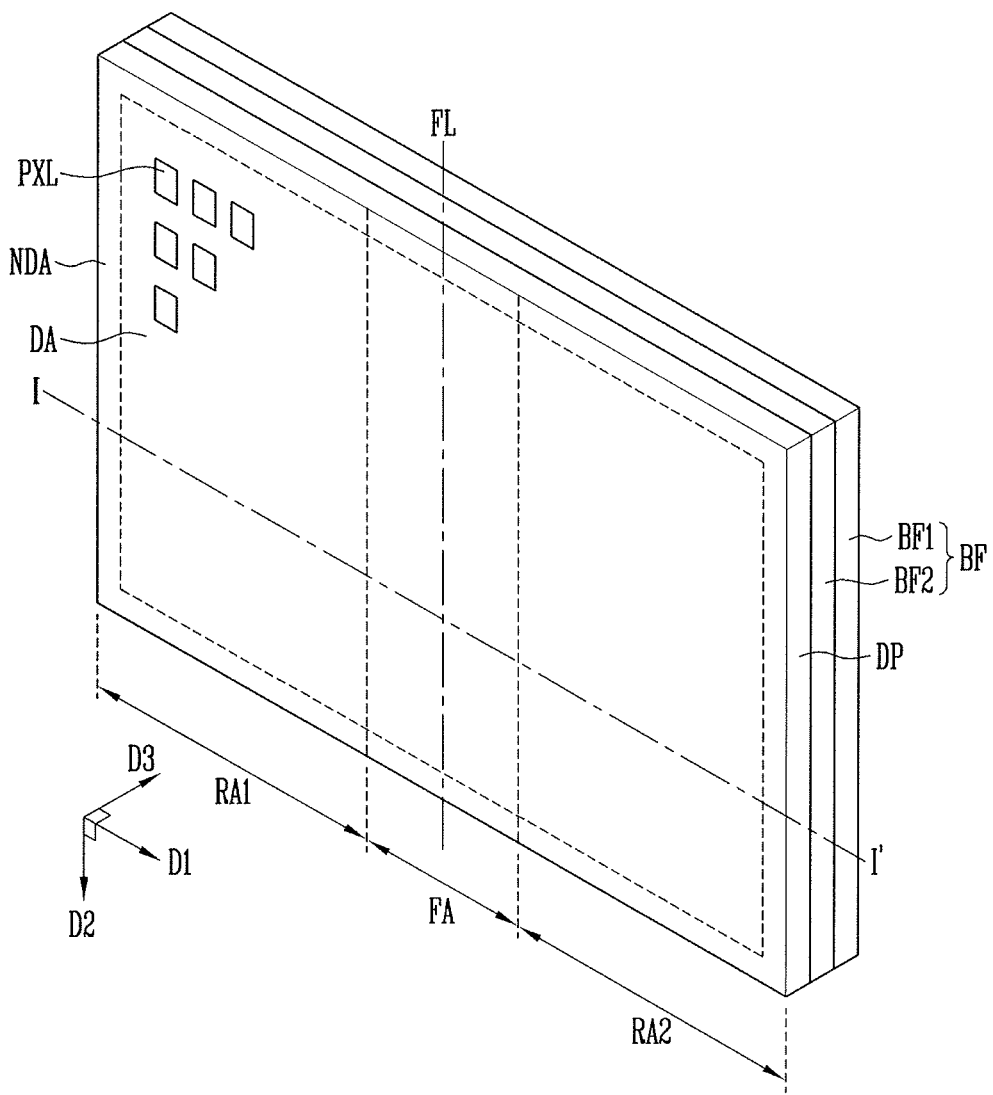
FIG. 1 illustrates a perspective view showing a display device according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

In the disclosure, the terms 'top surface' and 'bottom surface' are used as relative concepts to facilitate the understanding of the inventive concept. Therefore, 'top surface' and 'bottom surface' do not designate a specific direction, position, or component and may be interchangeable. For example, 'top surface' may be interpreted as 'bottom surface' and 'bottom surface' may be interpreted as 'top surface.' Therefore, 'top surface' may be represented as 'first face' and 'bottom surface' may be represented as 'second side', while 'top surface' may be represented as 'second side' and 'bottom surface' may be represented as 'first side'. However, 'top surface' and 'bottom surface' are not mixed with each other in one embodiment.

Figure 2A:
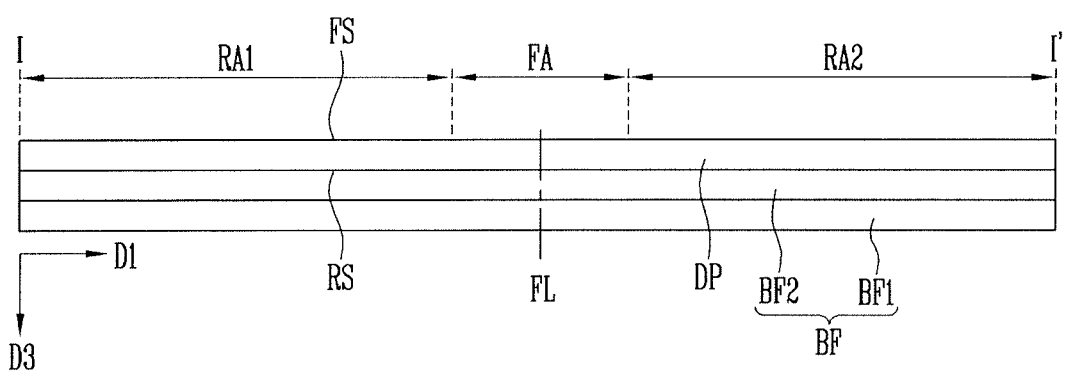
FIG. 2A illustrates a sectional view taken along line I-I' of FIG. 1.
Figure 2B:
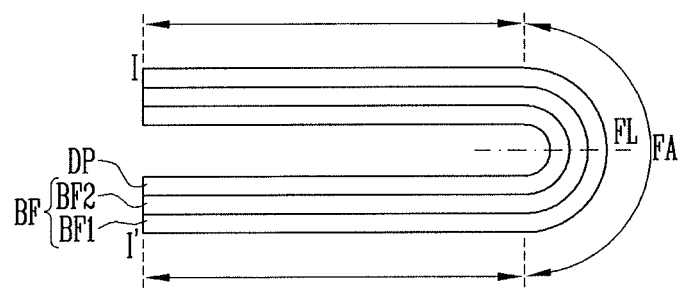
FIG. 2B illustrates a sectional view showing when the display device of FIG. 1 is folded.

FIG. 1 illustrates a perspective view showing a display device according to an embodiment of the present disclosure. FIG. 2A illustrates a sectional view taken along line I-I' of FIG. 1. FIG. 2B illustrates a sectional view showing when the display device of FIG. 1 is folded.

Referring to FIGS. 1, 2A, and 2B, the display device according to the embodiment of the present disclosure may be a foldable or bendable display device.

The display device may be provided in various shapes. For example, the display device may be provided in the shape of a rectangular plate having two pairs of sides parallel to each other. When the display device is provided in the shape of a rectangular plate, any one pair of sides among two pairs of sides may be provided longer than the other pair of sides. In the embodiment of the present disclosure, a case where the display device has a rectangular shape having a pair of long sides and a pair of short sides is illustrated for convenience of description, and the extending direction of the long sides is designated as a first direction D1, the extending direction of the short sides is designated as a second direction D2, and the direction perpendicular to the extending directions of the long and short sides is designated as a third direction D3.

In an implementation, the display device may have various shapes. For example, the display device may be provided in various shapes such as a closed-shape polygon including linear sides, a circle, an ellipse, etc., including curved sides, and a semicircle, a semi-ellipse, etc., including linear and curved sides. In an embodiment of the present disclosure, when the display device has linear sides, at least one portion of corners of each of the shapes may be formed in a curve. For example, when the display device has a rectangular shape, a portion at which adjacent linear sides meet each other may be replaced with a curve having a predetermined curvature. For example, a vertex portion of the rectangular shape may be formed with a curved side having both adjacent ends respectively connected to two adjacent linear sides, the curved side having a predetermined curvature. The curvature may be differently set or selected depending on a position. For example, the curvature may be changed depending on a position at which the curve is started, a length of the curve, etc.

At least one portion of the display device may have flexibility, and the display device may be folded at the portion having the flexibility. For example, the display device may include a foldable area having the flexibility, the foldable area in which the display device is foldable, and a rigid area provided at one or more side of the foldable area, the rigid area in which the display device is not folded.

In the embodiment of the present disclosure, an area in which the display panel is not folded is referred to as the rigid area, but this is provided for convenience of description. The term "rigid" includes not only a case where the rigid area is hard without flexibility but also a case where the rigid area has flexibility but may have a smaller flexibility than the foldable area and a case where the rigid area may have flexibility but is not folded.

In an embodiment of the present disclosure, the entire display device may correspond to the foldable area. For example, in the case of a display device rolled like a roll, the entire display device may correspond to the foldable area.

In the embodiment of the present disclosure, a case where a first rigid area RA1, a foldable area FA, a second rigid area RA2 are sequentially arranged along the first direction D1 has been disclosed as an example. The foldable area FA may extend along the second direction D2.

A line (e.g., center line) on which the display device is folded may be a folding line FL. In an implementation, the folding line FL may be provided in plurality, and the plurality of folding lines FL may be provided in the foldable area FA. In an implementation, the folding line FL may pass through the center of the foldable area FA, and the foldable area FA may be axisymmetric with respect to the folding line FL. In an implementation, the folding line FL may be provided asymmetrically in the foldable area FA. The foldable area FA and the folding line FL on the foldable area FA may overlap with an area in which an image of a display panel DP is displayed. When the display device is folded, the area in which the image is displayed may be folded.

In an embodiment, the term "folded" does not mean a fixed shape but means a shape deformable into another shape from the original shape, and includes a shape folded, curved, or rolled like a roll along one or more specific lines, i.e., the folding line FL. Therefore, a state in which one surfaces of the two rigid areas are located in parallel to each other and folded to face each other has been illustrated in the embodiment of the present disclosure. In an implementation, the surfaces of the two rigid areas may be folded to form a predetermined angle (e.g., an acute angle, a right angle, or an obtuse angle) with the foldable area interposed therebetween. This will be described in greater detail below.

In the display device, the folding line FL may be provided in the foldable area FA along the second direction D2 that is the extending direction of the foldable area FA. Accordingly, the display device may be folded in the foldable area FA.

In an implementation, the first and second rigid areas RA1 and RA2 may have a similar area, and the foldable area FA may be located between the two rigid areas RA1 and RA2. In an implementation, the first and second rigid areas RA1 and RA2 may have areas different from each other. In an implementation, the number of rigid areas is not necessarily two, and may be one or three or more. In this case, a plurality of rigid areas may be provided to be spaced apart from each other with the foldable area FA interposed therebetween.

The display device according to the embodiment of the present disclosure may include the display panel DP and a member provided on a rear surface RS of the display panel DP, the member having a predetermined thickness. The member may serve as a buffer member, e.g., a stress relief layer, for buffering impact or stress applied to the display panel DP. Hereinafter, the member is referred to as a buffer member BF.

The display panel DP displays arbitrary visual information, e.g., a text, a video, a picture, a two-dimensional, or three-dimensional image, etc. The kind of the display panel DP may be a suitable display panel DP that displays images.

The display panel DP may have a shape of a plate having two (e.g., opposing) surfaces. One of the surfaces may be a front surface FS, and the other may be the rear surface RS. The display panel DP may display an image on the front surface FS. In an implementation, the display panel DP may display an image on both of the front surface FS and the rear surface RS. In the embodiment of the present disclosure, a case where the display panel DP displays an image on the front surface FS is described as an example.

The display panel DP may include a display area DA (in which the image is displayed) and a non-display area NDA (at one or more sides of the display area DA). For example, the non-display area NDA may be provided in a shape surrounding the display area DA.

The display area DA may be an area in which a plurality of pixels PXL are provided to display an image.

The display area DA may be provided in a shape corresponding to that of the display device. For example, like the shape of the display device, the display area DA may be provided in various shapes such as a closed-shape polygon including linear sides, a circle, an ellipse, etc., including curved sides, and a semicircle, a semi-ellipse, etc., including linear and curved sides. In an implementation, the display area DA may be provided in a rectangular shape.

The pixels PXL may be provided on the display area DA. Each of the pixels PXL may be a minimum unit for displaying an image, and may be provided in plurality. The pixels PXL may emit white light and/or color light. In an implementation, each pixel PXL may emit light of one of red, green, and blue. In an implementation, each pixel PXL may emit light of a color such as cyan, magenta, or yellow.

In an implementation, the pixel PXL may be a light emitting device including an organic light emitting layer. For example, the pixel may be implemented in various forms such as a liquid crystal device, an electrophoretic device, and an electrowetting device.

Figure 3:
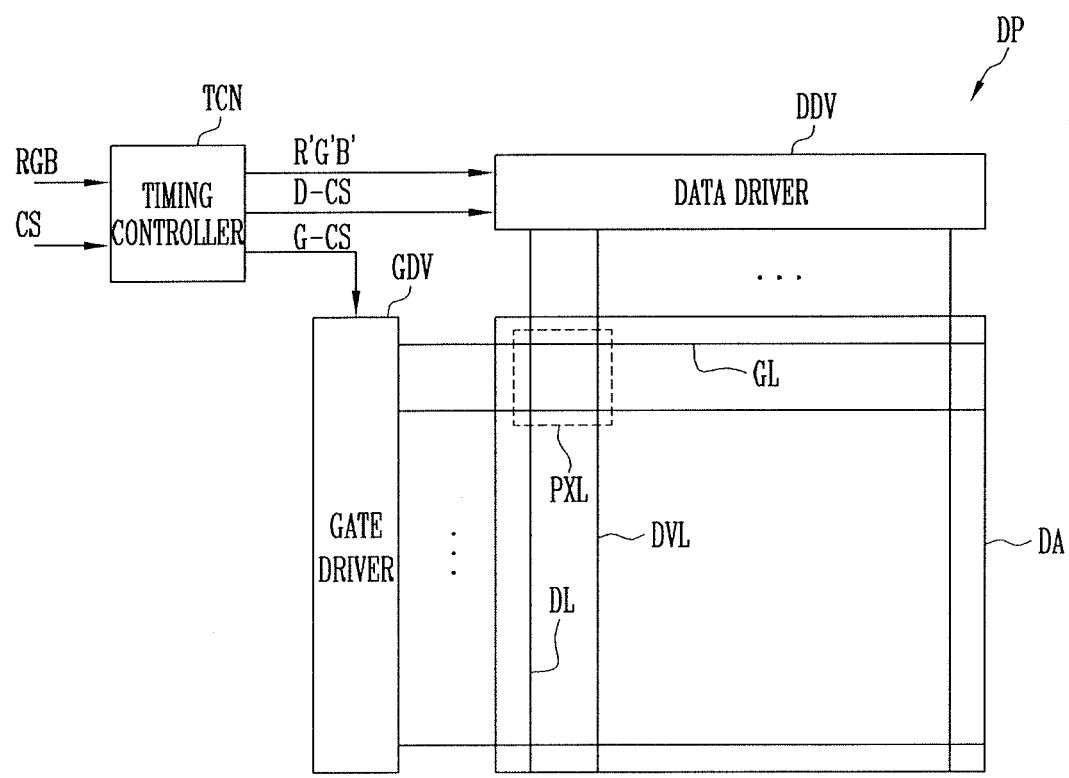
FIG. 3 illustrates a block diagram of a display panel according to the embodiment of the present disclosure.
Figure 4:
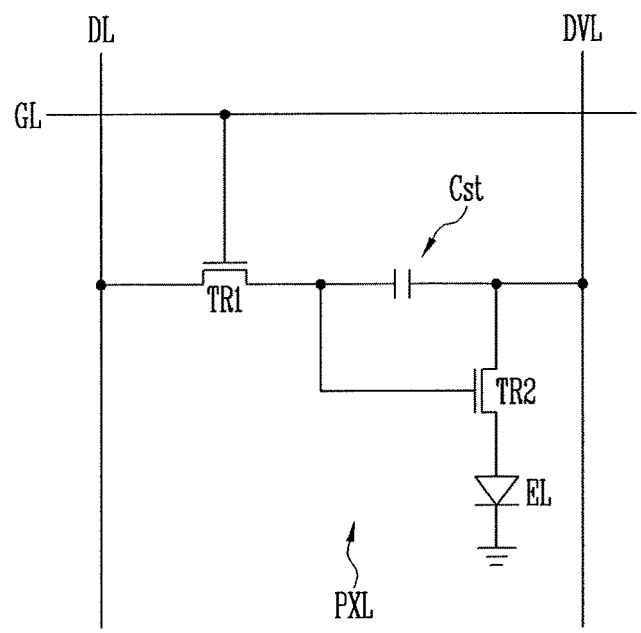
FIG. 4 illustrates a circuit diagram of one pixel in FIG. 3.

FIG. 3 illustrates a block diagram of the display panel DP according to the embodiment of the present disclosure. FIG. 4 illustrates a circuit diagram of one pixel PXL in FIG. 3.

Referring to FIGS. 3 and 4, the display device according to the present disclosure may include pixels PXL provided on a display area DA, gate and data drivers GDV and DDV for driving the pixels PXL, and a timing controller TCN for controlling the driving of the gate and data drivers GDV and DDV.

Each pixel PXL may be provided on the display area DA, and may include a line unit including a gate line GL, a data line DL, and a driving voltage line DVL, a thin film transistor connected to the line unit, an organic light emitting device EL connected to the thin film transistor, and a capacitor Cst.

The gate line GL may extend in one direction. The data line DL may extend in another direction intersecting the gate line GL. The driving voltage line DVL may extend in the substantially same direction as the data line DL. The gate line GL may transmit a gate signal to the thin film transistor. The data line DL may transmit a data signal to the thin film transistor. The driving voltage line DVL may provide a driving voltage to the thin film transistor.

The thin film transistor may include a driving thin film transistor TR2 for controlling the organic light emitting device EL and a switching thin film transistor TR1 for switching the driving thin film transistor TR2. In an implementation, one pixel PXL may include two thin film transistors TR1 and TR2. In an implementation, the one pixel PXL may include one thin film transistor and one capacitor, or may include three or more thin film transistors and two or more capacitors.

A gate electrode of the switching thin film transistor TR1 may be connected to the gate line GL, and a source electrode of the switching thin film transistor TR1 may be connected to the data line DL. A drain electrode of the switching thin film transistor TR1 may be connected to a gate electrode of the driving thin film transistor TR2. The switching thin film transistor TR1 may transmit, to the driving thin film transistor TR2, a data signal applied to the data line DL, in response to a gate signal applied to the gate line GL.

The gate electrode of the driving thin film transistor TR2 may be connected to the drain electrode of the switching thin film transistor TR1 and a source electrode of the driving thin film transistor TR2 may be connected to the driving voltage line DVL. A drain electrode of the driving thin film transistor TR2 may be connected to the organic light emitting device EL.

The organic light emitting device EL may include a light emitting layer and a first electrode and a second electrode, which may be opposite to each other with the light emitting layer interposed therebetween. The first electrode may be connected to the drain electrode of the driving thin film transistor TR2. A common voltage may be applied to the second electrode, and the light emitting layer may emit light according to an output signal of the driving thin film transistor TR2, so that light is emitted or is not emitted, thereby displaying an image. In an embodiment, the light emitted from the light emitting layer may be white light or color light.

The capacitor Cst may be connected between the gate electrode and the source electrode of the driving thin film transistor TR2. The capacitor Cst charges and maintains a data signal input to the gate electrode of the driving thin film transistor TR2.

The timing controller TCN may receive a plurality of image signals RGB and a plurality of control signals CS from an outside of the display device. The timing controller TCN may convert data formats of the image signals RGB to be suitable for interface specifications with the data driver DDV, and may provide the converted image signals R'G'B' to the data driver DDV. In addition, the timing controller TCN may generate a data control signal D-CS (e.g., an output start signal, a horizontal start signal, etc.) and a gate control signal G-CS (e.g., a vertical start signal, a vertical clock signal, vertical clock bar signal, etc.), based on the plurality of control signals CS. The data control signal D-CS may be provided to the data driver DDV, and the gate control signal G-CS is provided to the gate driver GDV.

The gate driver GDV sequentially output a gate signal in response to the gate control signal G-CS provided from the timing controller TCN. Thus, the plurality of pixels PXL may be sequentially scanned in unit of rows by the gate signal.

The data driver DDV converts the image signals R'G'B' into data signals and outputs the converted data signals, in response to the data control signal D-CS provided from the timing controller TCN. The output data signals may be applied to the pixels PXL.

Thus, each pixel PXL may be turned on by the gate signal, and the turned-on pixel PXL receives a corresponding data voltage from the data driver DDV, thereby displaying an image having a desired gray level.

Referring to FIGS. 1, 2A, and 2B, the buffer member BF may be provided on the rear surface RS of the display panel DP to protect the display panel DP from impact or stress.

Each of the display panel DP and the buffer member BF in the display device may have a foldable area FA and rigid areas RA1 and RA2. The foldable area FA of the display panel DP may correspond to that of the buffer member BF, and the rigid areas RA1 and RA2 of the display panel DP may correspond to those of the buffer member BF.

The buffer member BF may be provided on one surface of the display panel DP. In an implementation, the buffer member BF may be provided on the rear surface RS of the display panel DP. The buffer member BF may directly contact the rear surface RS of the display panel DP. In an implementation, the buffer member BF may be attached to the rear surface RS of the display panel DP with an adhesive or cohesive agent interposed therebetween.

The buffer member BF may be provided in a plate shape corresponding to the shape of the display panel DP. The buffer member BF may cover at least one portion of the rear surface RS of the display panel DP. In an implementation, when the display panel DP is provided in a rectangular shape, the buffer member BF may also be provided in a rectangular shape corresponding to that of the display panel DP. In an implementation, when the display panel DP is provided in a circular shape, the buffer member BF may also be provided to a circular shape corresponding to that of the display panel DP.

The buffer member BF may buffer (e.g., absorb or otherwise compensate for) an external impact or stress, so that it is possible to help prevent the display panel DP from being damaged or malfunctioned by the external impact. The external impact may refer to an external force such as a pressure or a stress, which could cause a defect of the display panel DP.

The buffer member BF may have an elastic force, to absorb the external impact or stress and simultaneously allow the external impact or stress to be scattered to its surroundings. For example, the buffer member BF may have an elastic force where the buffer member BF is deformed by an external pressure, and, if the external pressure is removed, the shape of the buffer member BF may be returned to the original state.

In an implementation, the buffer member BF may be made of an insulative material. In an implementation, at least one portion of the buffer member BF may be made of a conductive material. In an implementation, the buffer member BF may be a cushion member that causes physical and/or electrical deformation according to a touch and/or a pressure in a touch sensor and/or a pressure sensor. In this case, the buffer member BF may include a material that causes a change in resistance or capacitance according to the deformation. When the buffer member BF is a touch sensor and/or a pressure sensor, the buffer member BF may include an insulative organic polymer material and conductive particles such as nanoparticles included in the material.

The buffer member BF may include a first buffer member BF1 and a second buffer member BF2, which are sequentially stacked.

The first buffer member BF1 may be on the rear surface RS of the display panel DP. The second buffer member BF2 may be between the display panel DP and the first buffer member BF1. For example, the display panel DP, the second buffer member BF2, and the first buffer member BF1 may be sequentially arranged in the direction of the rear surface RS of the display panel DP.

The first buffer member BF1 and the second buffer member BF2 may have densities that are different from each other. The density of the first buffer member BF1 is a first density and the density of the second buffer member BF2 is a second density, and the first density and the second density may have values different from each other.

In an implementation, the second density may be greater than the first density. In an implementation, the second density may be less than the first density. In an implementation, the first density may be, e.g., about 0.7 g/cm³ to about 0.9 g/cm³, and the second density may be, e.g., about 0.3 g/cm³ to about 0.5 g/cm³.

Each of the first and second buffer members BF1 and BF2 may have an appropriate thickness suitable for buffering impact or stress applied thereto. In an implementation, the first buffer member BF1 may have a thickness of, e.g., about 60 μm to about 150 μm, and the second buffer member BF2 may have a thickness of, e.g., about 60 μm to about 150 μm. In an implementation, each of the first and second buffer members BF1 and BF2 may have a thickness of about 100 μm. In an implementation, the first and second buffer members BF1 and BF2 may be set to have thicknesses different from each other.

For example, the first buffer member BF1 and the second buffer member BF2 may have thicknesses equal to or different from each other according to the direction or degree of an external impact or stress applied to the display panel DP.

The first buffer member BF1 may help reduce a bending deformation of the display panel DP due to a point impact. The second buffer member BF2 may help reduce a compression deformation and/or a tensile deformation of the display panel DP due to a surface or wider area impact. In an implementation, a relatively high-density buffer member BF may help reduce the bending deformation due to the point impact, and a relatively low-density buffer member BF may help reduce the compression deformation and/or the tensile deformation due to the surface impact.

The first buffer member BF1 may help buffer an impact applied to the front surface FS of the display panel DP. The front surface FS of the display panel DP may frequently come in contact with a sharp external tool such as a stylus pen. The impact applied to the front surface FS of the display panel DP by the tool may correspond to a point impact has a relatively narrow contact area with the display panel. Accordingly, the impact may correspond to a point impact that applies a high pressure to a narrow or small area of the display panel DP when the tool drops from the top. As a result, a bending deformation could occur where the display panel DP is bent at its impact position, and the bending deformation of the display panel DP could cause a bright spot defect. For example, the first buffer member BF1 may be a bending deformation buffer layer.

In order to help reduce the possibility of and/or prevent the defect of the display panel DP due to the bending deformation, the first buffer member BF1 may partially absorb an external impact and may flatly support the display panel DP from the bottom (e.g., rear surface RS) such that the display panel DP is not bent. If the density of the first buffer member BF1 were to be lower than a specific density, e.g., about 0.7 g/cm³, the first buffer member BF1 could also be bent, and therefore, the impact applied to the display panel DP may not be buffered. If the density of the first buffer member BF1 were to exceed a specific density, e.g., about 0.9 g/cm³, the impact applied to the display panel DP may not be absorbed. In an implementation, the first buffer member BF1 may have a thickness of, e.g., about 60 μm to about 150 μm, and the second buffer member BF2 may have a thickness of, e.g., about 60 μm to about 150 μm. Maintaining the thickness of each of the first buffer member BF1 and the second buffer member BF2 within the above-described range may help ensure that any impact applied to the display panel DP is sufficiently absorbed.

The second buffer member BF2 may buffer an impact applied to the rear surface RS of the display panel DP. An impact generated by a sharp tool such as a stylus pen may rarely be applied to the rear surface RS of the display panel DP. An impact generated by a tool or other item having a relatively wide contact area may be more likely to be applied to or occur at the rear surface RS of the display panel DP. Accordingly, the impact applied to the rear surface RS of the display panel DP by the tool or other item may correspond to a surface impact that applies a high pressure to a wide or large area of the display panel DP, e.g., when the tool or device drops from the top. As a result, the display panel could be compressed at its impact position and stretched near the impact position. Therefore, a compression deformation and a tensile deformation could occur. The compression deformation and the tensile deformation could cause a bright spot defect of the display panel DP. For example, the second buffer member BF2 may be a compression and tensile deformation buffer layer.

In order to help reduce the possibility of and/or prevent the defect of the display panel DP due to the compression deformation and the tensile deformation, the second buffer member BF2 may absorb both of the compression deformation and the tensile deformation. If the density of the second buffer member BF2 were to be lower than a specific density, e.g., about 0.3 g/cm³, it could be difficult to maintain the shape of the second buffer member BF2. If the density of the second buffer member BF2 were to exceed a specific density, e.g., about 0.5 g/cm³, it could be difficult to sufficiently absorb the impact applied to the display panel DP.

In each of the first and second buffer members BF1 and BF2, the density and the thickness may be appropriately adjusted, and accordingly, it is possible to provide a display device strong against point impact and surface impact.

In an implementation, the first and second buffer members BF1 and BF2 may be made of a porous polymer to have elasticity. In an implementation, the first and second buffer members BF1 and BF2 may be provided in the form of a foam such as a sponge.

In an implementation, each of the first and second buffer member BF1 and BF2 may independently include at least one of, e.g., polystyrene, polyolefin, polyurethane, polyamides, synthetic rubbers, polydimethylsiloxane, polybutadiene, polyisobutylene, poly(styrene-butadiene-styrene), polychloroprene, polyethylene, silicone, and combinations thereof. In an implementation, the materials of the first and second buffer member BF1 and BF2 may be the same or may be different from each other.

In an implementation, the buffer member BF may be manufactured by coating the first buffer member BF1 on a substrate, coating the second buffer member BF2 on the first buffer member BF1, and then removing substrate. In an implementation, the buffer member BF may be manufactured by coating the second buffer member BF2, coating the first buffer member BF1 on the second buffer member BF2, and then removing the substrate.

In an implementation, the buffer member BF including the first buffer member BF1 and the second buffer member BF2 may be provided so as to buffer impacts respectively applied to the front surface FS and the rear surface RS of the display panel. In an implementation, the buffer member BF may not provided in only a two layer structure, but may be provided in three or more layer structure.

Figure 5:
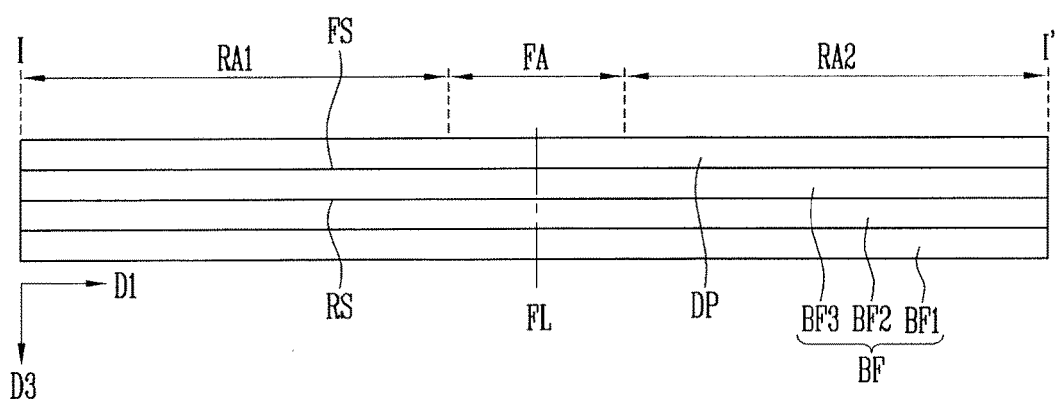
FIG. 5 illustrates a sectional view of the display device according to the embodiment of the present disclosure.

FIG. 5 illustrates a sectional view showing when the buffer member BF is provided in a three layer structure of first to third buffer members BF1, BF2, and BF3.

Referring to FIG. 5, when the first to third buffer members BF1, BF2, and BF3 and the display panel DP are sequentially provided, the first to third buffer members BF1, BF2, and BF3 may have densities different from one another. If it is assumed that the densities of the first to third buffer members BF1, BF2, and BF3 are first to third densities, respectively, the densities may be large, e.g., may go from larger to smaller, in the order of the first density, the second density, and the third density.

In an implementation, the first buffer member BF1 and the second buffer member BF2 may have the same thickness over the entire rear surface RS of the display panel DP. In an implementation, the first buffer member BF1 and the second buffer member BF2 may be independently provided in various forms on the rear surface RS of the display panel DP by considering a case where the position of an impact applied to the display panel DP is changed.

FIGS. 6A to 6E illustrate sectional views showing various shapes of the buffer member BF in the display device according to the embodiment of the present disclosure.

Figure 6A:
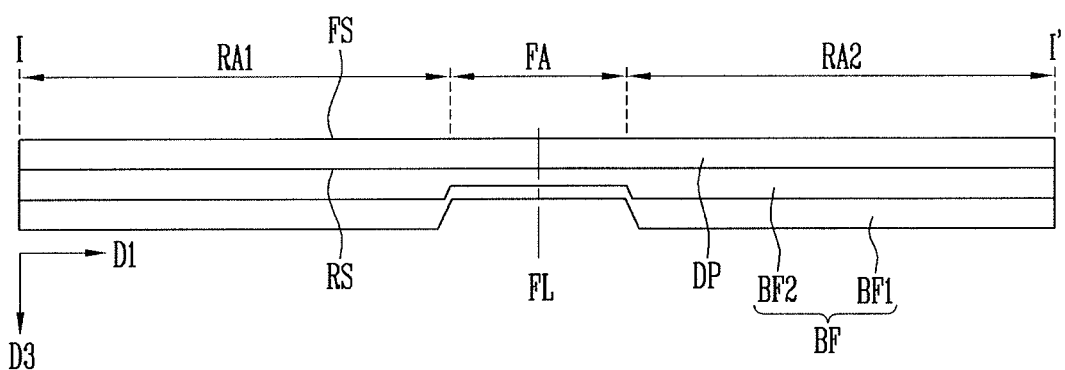
FIGS. 6A to 6E illustrate sectional views showing various shapes of a buffer member in the display device according to the embodiment of the present disclosure.

Referring to FIG. 6A, in an embodiment of the present disclosure, at least one of the first buffer member BF1 and the second buffer member BF2 may have a thickness in a portion of the areas overlapping with the display panel DP, which is different from that in another portion of the areas. For example, in this embodiment, each of the first and second buffer members BF1 and BF2 may have different thicknesses in the foldable area FA and the rigid areas RA1 and RA2. For example, each of the first and second buffer members BF1 and BF2 may have a thickness in the foldable area FA, which is smaller than a thickness thereof in the rigid areas RA1 and RA2. In an implementation, each of the first and second buffer members BF1 and BF2 may have a thickness in the foldable area FA, which is greater than a thickness thereof in the rigid areas RA1 and RA2.

Figure 6B:
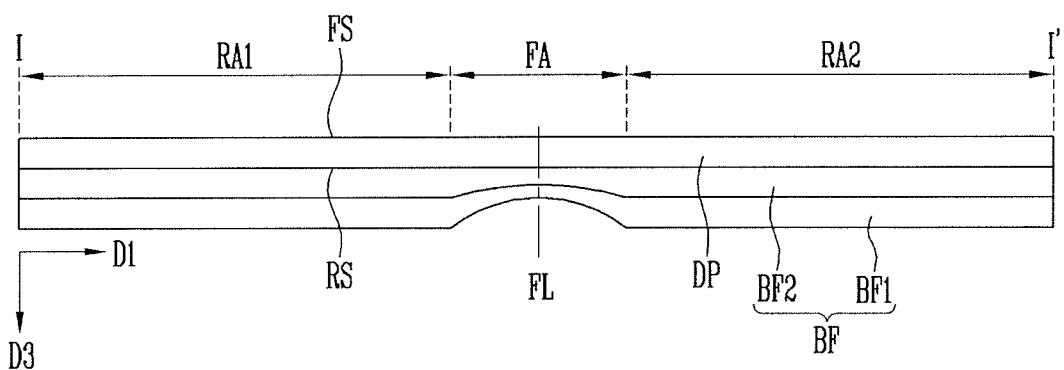

Referring to FIG. 6B, each of the first and second buffer members BF1 and BF2 may have different thicknesses in the foldable area FA and the rigid areas RA1 and RA2, and the thickness in the foldable area FA may be changed or variable. For example, the thickness of each of the first and second buffer members BF1 and BF2 may be decreased or thinner closer to the folding line FL in the foldable area FA, and may approximate to the thickness in the rigid areas RA1 and RA2 closer to the rigid areas RA1 and RA2. In an implementation, the thickness of each of the first and second buffer members BF1 and BF2 may increase closer to the folding line FL in the foldable area FA, and may approximate to the thickness in the rigid areas RA1 and RA2 closer to the rigid areas RA1 and RA2.

Figure 6C:
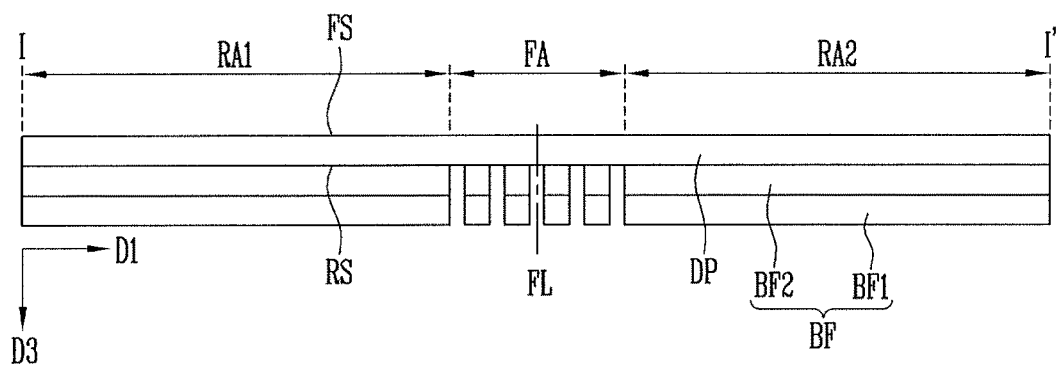

Referring to FIG. 6C, at least one of the first and second buffer members BF1 and BF2 may overlap with a portion of the display panel DP.

In an implementation, each of the first and second buffer members BF1 and BF2 may be provided as a single body. In an implementation, at least one of the first and second buffer members BF1 and BF2 may be provided in plurality. In an implementation, the first buffer member BF1 may be provided in one, and the second buffer member BF2 may be provided in two or more, which are separated from each other. In an implementation, the first buffer member BF1 may be provided in two or more, which are separated from each other, and the second buffer member BF2 may be provided in one. In an implementation, each of the first and second buffer members BF1 and BF2 may be provided in plurality.

In an implementation, the first and second buffer members BF1 and BF2 may be provided to have different thicknesses in the foldable area FA and the rigid areas RA1 and RA2. For example, only a portion of each of the first and second buffer members BF1 and BF2 may overlap with the display panel DP in the foldable area FA, and the whole of each of the first and second buffer members BF1 and BF2 may overlap with the display device DP in the rigid areas RA1 and RA2. In an implementation, the whole of each of the first and second buffer members BF1 and BF2 may overlap with the display device DP in the foldable area FA, and only a portion of each of the first and second buffer members BF1 and BF2 may overlap with the display panel DP in the rigid areas RA1 and RA2.

Figure 6D:
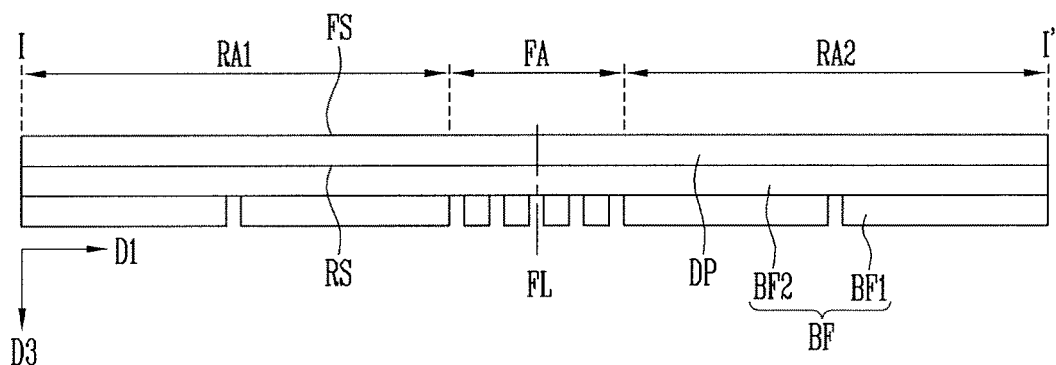

Referring to FIG. 6D, the first and second buffer members BF1 and BF2 may be provided in shapes different from each other. As shown in this figure, the second buffer member BF2 may overlap with the entire display panel DP, and only a portion of the first buffer member BF1 may overlap with the display panel DP. In addition, the first buffer member BF1 may overlap with the display panel DP to have different areas in the foldable area FA and the rigid areas RA1 and RA2. In an implementation, the first buffer member BF1 may independently overlap with the display panel DP to have various areas in different areas.

Figure 6E:
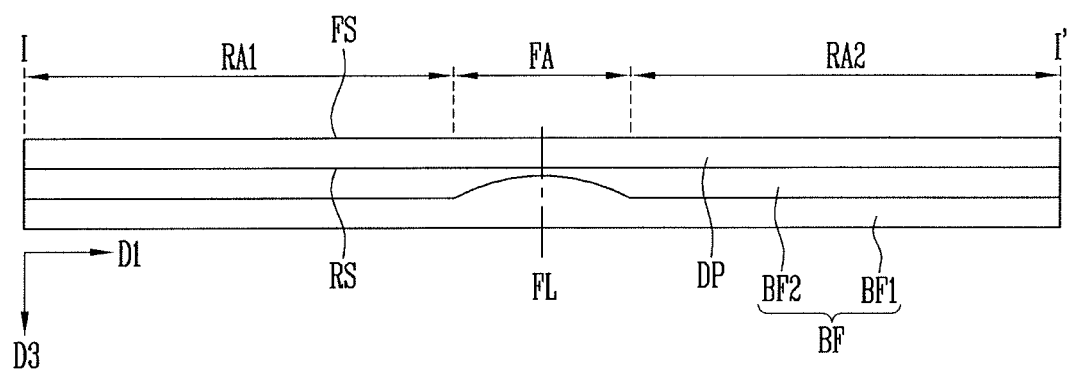

Referring to FIG. 6E, in the first and second buffer members BF1 and BF2, the thicknesses of the first and second buffer members BF1 and BF2 may be different from each other while the entire or sum thickness of the first and second buffer members BF1 and BF2 is being maintained (e.g., the overall thickness of the buffer member BF may remain constant). For example, the first buffer member BF1 may include a protruding part protruding in the direction of the second buffer member BF2. The thickness of the first buffer member BF1 at a portion at which the protruding part is formed may be thicker than that of the first buffer member BF1 at a portion at which the protruding part is not formed. In an implementation, the protruding part may be formed in the foldable area FA. In an implementation, the protruding part may be formed in the rigid areas RA1 and RA2. In an implementation, the first buffer member BF1 may have a concave part, and the thickness of the first buffer member BF1 at a portion at which the concave part is formed may be thinner than that of the first buffer member BF1 at a portion at which the concave part is not formed.

In an implementation, the first buffer member BF1 may have different thicknesses in a middle area (in consideration that a stylus pen may be frequently used there) and an edge area (in consideration that the stylus pen may be rarely used there). In addition, the second buffer BF2 may have different thicknesses in an edge area of the display panel DP, to which an impact from an external tool or item may be more frequently applied, and a middle area of the display panel DP, to which the impact from the external tool or item may be less frequent.

In an implementation, each of the first and second buffer members BF1 and BF2 may be provided in various forms according to the display area DA and the non-display area NDA.

In an implementation, each of the first and second buffer members BF1 and BF2 may have the same density over the entire rear surface RS of the display panel DP. In an implementation, at least one of the first and second buffer members BF1 and BF2 may have a density in a portion of the areas overlapping with the display panel DP that is different from the density in another portion of the areas.

In an implementation, the first and second buffer members BF1 and BF2 may have different densities in the foldable area FA and the rigid areas RA1 and RA2. In an implementation, the first and second buffer members BF1 and BF2 may have different densities in the display area DA and the non-display area NDA. In an implementation, the first and second buffer members BF1 and BF2 may have different densities in the display area DA according to the kind of expected impact or stress. For example, the first buffer member BF1 may have different densities in a middle area (where a stylus pen may be frequently used) and an edge area (where the stylus pen may be less frequently used). In this case, the density in the middle area may be higher than that in the edge area. In an implementation, the second buffer BF2 may be formed to have different densities in an edge area of the display panel DP, to which an impact from an external tool or item may more frequently occur, and a middle area of the display panel DP, to which the impact from the external tool or item may be less frequent.

Figure 7:
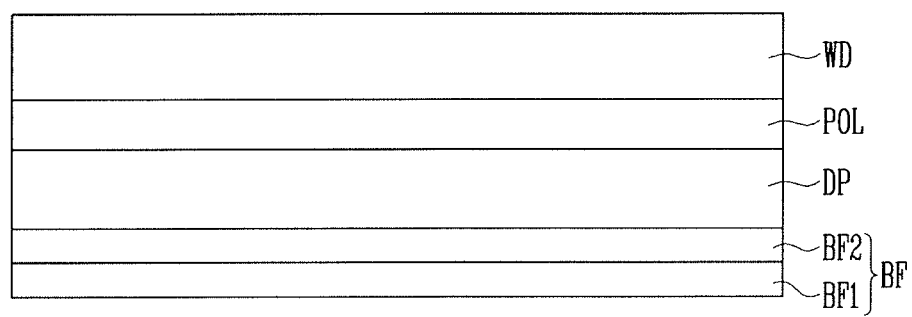
FIG. 7 illustrates a sectional view showing a display device according to an embodiment of the present disclosure.

FIG. 7 illustrates a sectional view showing a display device according to an embodiment of the present disclosure.

Referring to FIG. 7, the display device according to the embodiment of the present disclosure may include, e.g., a display panel DP, a buffer member BF provided on a rear surface of the display panel DP, and a polarizing layer POL and a window WD, which are sequentially provided on a front surface of the display panel DP.

In the following embodiments, differences from the above-described embodiments will be mainly described to avoid redundancy, and components substantially identical to those of the above-described embodiments are designated by like reference numerals.

The display panel DP may be provided in the shape of a plate having front and rear surfaces (hereinafter, see FIG. 1), and an image may be displayed on the front surface.

The buffer member BF may be provided on the rear surface of the display panel DP to protect the display panel DP from impact or stress. The buffer member BF may include a first buffer member BF1 and a second BF2, which are sequentially stacked.

The polarizing layer POL may be provided on the front surface of the display panel DP. The polarizing layer POL may be attached to the front surface of the display panel DP with an adhesive interposed therebetween.

The polarizing layer POL may help prevent reflection of external light. In an implementation, the polarizing layer POL may be omitted or replaced with a different kind of optical film, or the different kind of optical film may be further added.

In an implementation, a touch sensor for sensing a touch may be further included between the polarizing layer POL and the display panel DP. In an implementation, the touch sensor is not be included between the polarizing layer POL and the display panel DP, but may be included in the display panel DP.

The window WD may be provided on the polarizing layer POL to help protect the display panel DP. The window WD may be made of glass or a transparent insulative material such as an organic polymer. The window WD may be larger than a display area of the display panel DP or may have the substantially same size as the display area of the display panel DP. The buffer member BF may include the first buffer member BF1 and the second buffer member BF2, which are sequentially stacked.

The first buffer member BF1 may be provided on the rear surface of the display panel DP. The second buffer member BF2 may be provided between the display panel DP and the first buffer member BF1. Accordingly, the display panel DP, the second buffer member BF2, and the first buffer member BF1 may be sequentially arranged in the direction of the rear surface of the display panel DP. The first buffer member BF1 and the second buffer member BF2 may have densities different from each other as described above. In an implementation, the second density may have a larger value than the first density. In an implementation, the second density may have a smaller value than the first density. In an implementation, the first density may be about 0.7 $g/cm^3$ to about 0.9 $g/cm^3$, and the second density may be about 0.3 $g/cm^3$ to about 0.5 $g/cm^3$.

Each of the first and second buffer members BF1 and BF2 may be designed to have an appropriate thickness capable of buffering impact or stress applied thereto. For example, the first buffer member BF1 may have a thickness of about 60 µm to about 150 µm, and the second buffer member BF2 may have a thickness of about 60 µm to about 150 µm. In an implementation, each of the first and second buffer members BF1 and BF2 may have a thickness of about 100 µm.

Figure 8:
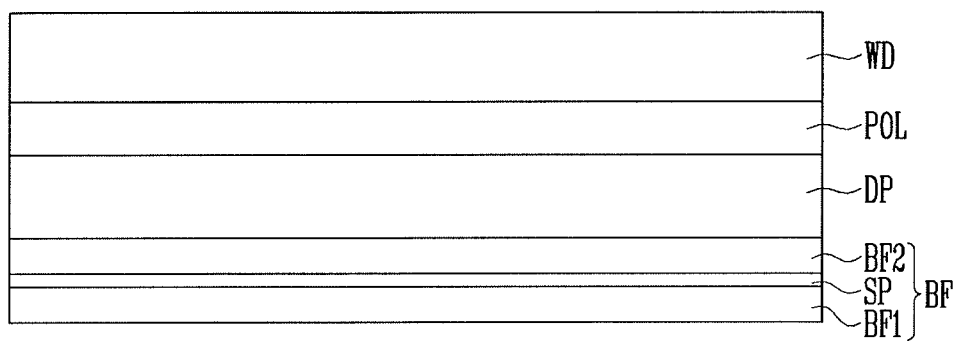
FIG. 8 illustrates a sectional view showing a display device according to an embodiment of the present disclosure.

FIG. 8 illustrates a sectional view showing a display device according to an embodiment of the present disclosure.

Referring to FIG. 8, the display device according to the embodiment of the present disclosure may include a display panel DP, a buffer member BF disposed on a rear surface of the display panel DP, and a polarizing layer POL and a window WD, which are sequentially disposed on a front surface of the display panel DP.

The buffer member BF may include a first buffer member BF1, a second buffer member BF2, and a support film SP provided between the first and second buffer members BF1 and BF2.

The support film SP may be provided between the first and second buffer members BF1 and BF2 to help support the first and second buffer members BF1 and BF2. The support film SP may be provided in the buffer member BF, so that the buffering effect of the buffer member BF may be increased.

In an implementation, the support film SP may be provided in various forms according to areas on the rear surface of the display panel DP by considering a case where the position of an external impact applied to the display panel DP is changed. For example, similarly to at least one of the first and second buffer members BF1 and BF2 described in FIGS. 6A to 6E, the support film SP may be provided in various forms on different areas. In an implementation, the support film SP may have a thickness in a foldable area, which is smaller or greater than that in a rigid area. In an implementation, the support film SP may overlap with the display panel DP to have different areas in the foldable area and the rigid area. In an implementation, the support film SP may have a concave or convex part in the foldable area and the rigid area.

In an implementation, the support film SP may have a thickness of about 30 µm.

The support film SP may include at least one of, e.g., polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, and triacetate cellulose, cellulose acetate propionate. In an implementation, the material of the support film SP may be variously changed, and the support film SP may be made of fiber reinforced plastic (FRP), etc.

In this embodiment, the buffer member BF may be manufactured by preparing the support film SP, coating the first buffer member BF1 on one surface of the support film SP, and then coating the second buffer member BF2 on the opposite surface of the support film SP. In an implementation, the buffer member BF may be manufactured by preparing the support film SP, coating the second buffer member BF2 on one surface of the support film SP, and then coating the first buffer member BF1 on the opposite surface of the support film SP.

In an implementation, the support film SP may be replaced with an adhesive layer. For example, the buffer member BF may include the first buffer member BF1, the second buffer member BF2, and an adhesive layer provided between the first and second buffer members BF1 and BF2.

The adhesive layer may connect the first and second buffer members BF1 and BF2 to each other and simultaneously supports the first and second buffer members BF1 and BF2.

In an implementation, the material of the adhesive member may include, e.g., an acryl-based copolymer.

The buffer member BF may be manufactured by individually preparing the first buffer member BF1 and the second buffer member BF2 and attaching the first buffer member BF1 and the second buffer member BF2 with the adhesive layer interposed therebetween.

Figure 9:
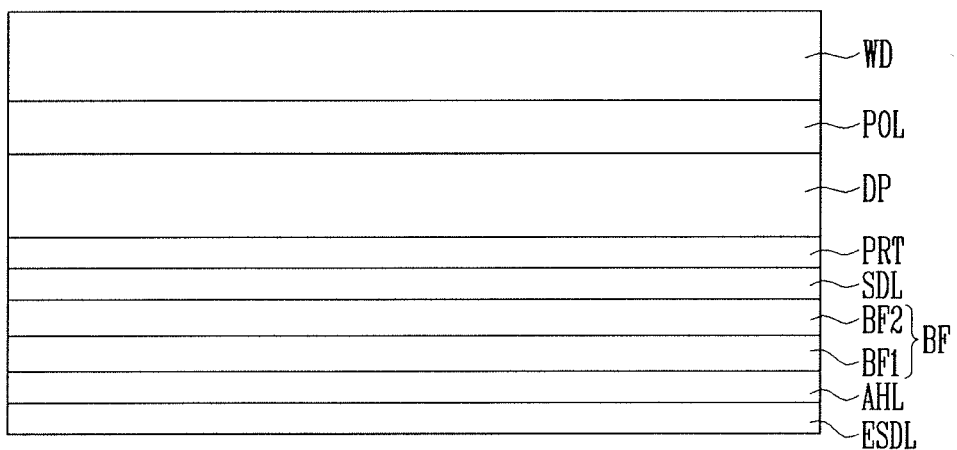
FIG. 9 illustrates a sectional view showing a display device according to an embodiment of the present disclosure.

FIG. 9 illustrates a sectional view showing a display device according to an embodiment of the present disclosure.

Referring to FIG. 9, the display device according to the embodiment of the present disclosure may include, e.g., a display panel DP, a polarizing layer POL and a window WD, which are provided on a front surface of the display panel DP, a buffer member BF provided on a rear surface of the display panel DP, a protective film PRT provided between the display panel DP and the buffer member BF, a light shielding layer SDL provided between the protective film PRT and the buffer member BF, a heat dissipation layer AHL provided on an outer surface of the buffer member BF, and an electromagnetic wave shielding layer ESDL provided on an outer surface of the heat dissipation layer AHL. For example, the display device may include the electromagnetic wave shielding layer ESDL, the heat dissipation layer AHL, the buffer member BF, the light shielding layer SDL, the protective film PRT, the display panel DP, the polarizing layer POL, and the window WD, which are sequentially stacked.

The protective film PRT may be attached to the rear surface of the display panel DP to protect the display panel DP. The protective film PRT may be attached to the display panel DP with an adhesive interposed therebetween.

The protective film PRT may be made of an organic polymer. The organic polymer may include, e.g., at least one of polyethylene, polypropylene, ethylene-propylene copolymer, ethylene-vinyl acetate copolymer, olefin based polymer, polyethylene terephthalate, polyethylene naphthalate, polybutylene terephthalate, polycarbonate, polyvinyl chloride, vinyl acetate based polymer, polyphenylene sulfide, polyamide, polyimide, polyether ether ketone, and polyether.

The light shielding layer SDL may help prevent light from being transmitted in the direction of the front surface of the display panel DP from the rear surface of the display panel DP. The light shielding layer SDL may be provided in the form of a light shielding film, and the color of the light shielding layer SDL may be black.

The heat dissipation layer AHL may help prevent heat generated in the display device from being provided to the display panel DP. The display panel DP may be disposed adjacent to a driver including a printed circuit board, etc., and hence heat generated from the driver may be transferred to the display panel DP. The heat may accelerate the degradation of each pixel, and therefore, a defect of the pixel may be caused. The heat dissipation layer AHL may help insulate and dissipate the heat generated from the driver.

The heat dissipation layer AHL may include a base material and a metal contained in the base material. In an implementation, the metal may include, e.g., aluminum (Al), copper (Cu), molybdenum (Mo), silver (Ag), titanium (Ti), and/or tungsten (W). The base material may be made of an organic polymer such as polycarbonate (PC) or polyethylene terephthalate (PET). In addition, the heat dissipation layer AHL may include a material that has excellent thermal conductivity and easily discharges heat. The heat dissipation layer AHL may include, e.g., graphite, graphene, carbon nanotube (CNT), and/or metal filler.

The electromagnetic wave shielding layer ESDL may help shield electromagnetic interference (EMI) generated from the driver.

The electromagnetic wave shielding layer ESDL may be configured as a conductive sheet. The conductive sheet may include at least one of gold (Au), silver (Ag), copper (Cu), aluminum (Al), titanium (Ti), indium tin oxide (ITO), indium zinc oxide (IZO), carbon nanotube (CNT), and graphite.

In an implementation, the electromagnetic wave shielding layer ESDL may be a copper sheet.

In the display device according to the embodiment of the present disclosure, a display area may be an unseparated single display area. In an implementation, the display area may be provided in plurality.

Figure 10:
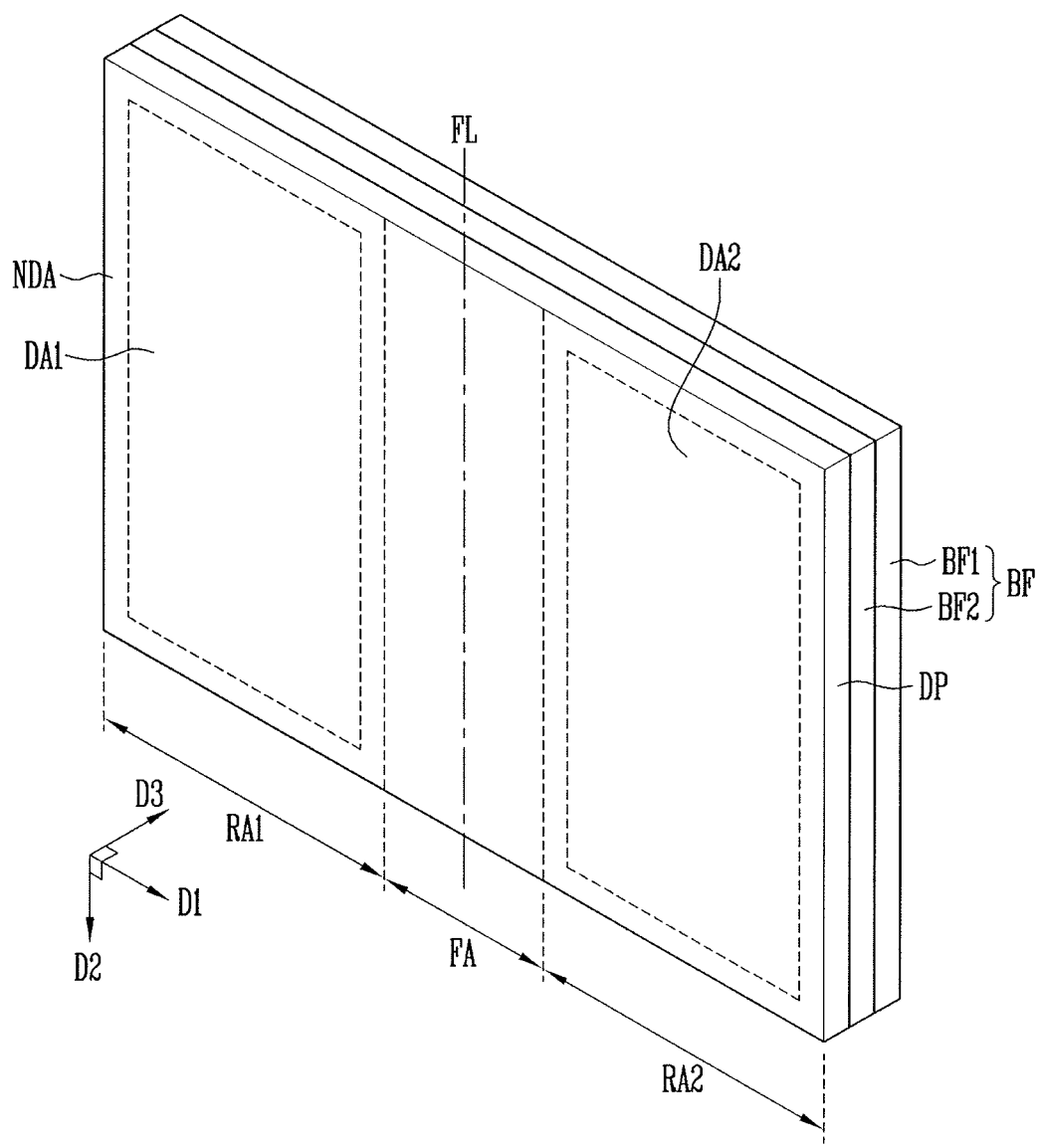
FIG. 10 illustrates a perspective view showing a display device according to an embodiment of the present disclosure.

FIG. 10 illustrates a perspective view showing a display device according to an embodiment of the present disclosure, in which two display areas are provided.

Referring to FIG. 10, the display device may include a plurality of display areas. For example, the display device may include a first display area DA1 and a second display area DA2. A non-display area NDA may be provided at a circumference of the first display area DA1 and the second display area DA2, and therefore, the first display area DA1 and the second display area DA2 may be spaced apart from each other with the non-display area NDA interposed therebetween. When viewed on a plane or in plan view, a display panel DP may include a first rigid area RA1, a second rigid area RA2, and a foldable area FA disposed between the first rigid area RA1 and the second rigid area RA2. The foldable area FA may overlap with the non-display area NDA between the first display area DA1 and the second display area DA2.

Like the above-described embodiments, a folding line FL may be provided in parallel to any one side of the display device. In an implementation, the folding line FL may be disposed in various directions regardless of the shape of the display device. For example, in an embodiment of the present disclosure, the folding line FL may be provided obliquely with respect to any one side of the display device.

Figure 11:
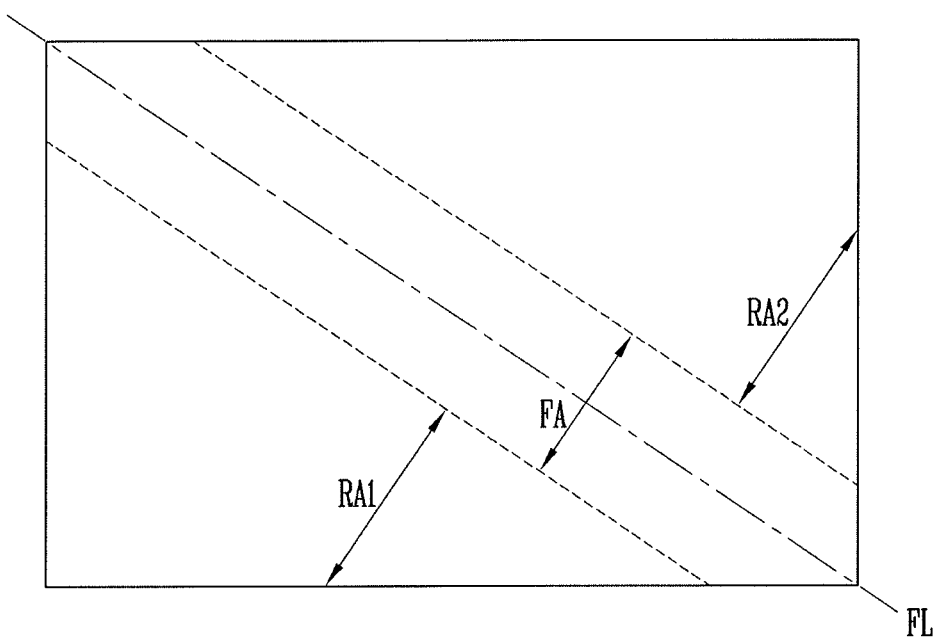
FIG. 11 illustrates a plan view showing a display device according to an embodiment of the present disclosure.

FIG. 11 is a plan view showing a display device according to an embodiment of the present disclosure, which schematically illustrates only rigid areas, a foldable area, and a folding line.

Referring to FIG. 11, in this embodiment, the display device may be provided in a rectangular shape, and a folding line FL may be provided along a diagonal line of the rectangular shape. In the display device, a foldable area FA may also be provided in a diagonal direction along the folding line FL, and a first rigid area RA1 and a second rigid area RA2 may be provided at both sides of the foldable area FA.

In an implementation, one folding line FL may be provided. In an implementation, the folding line FL may be provided in plurality.

Figure 12A:
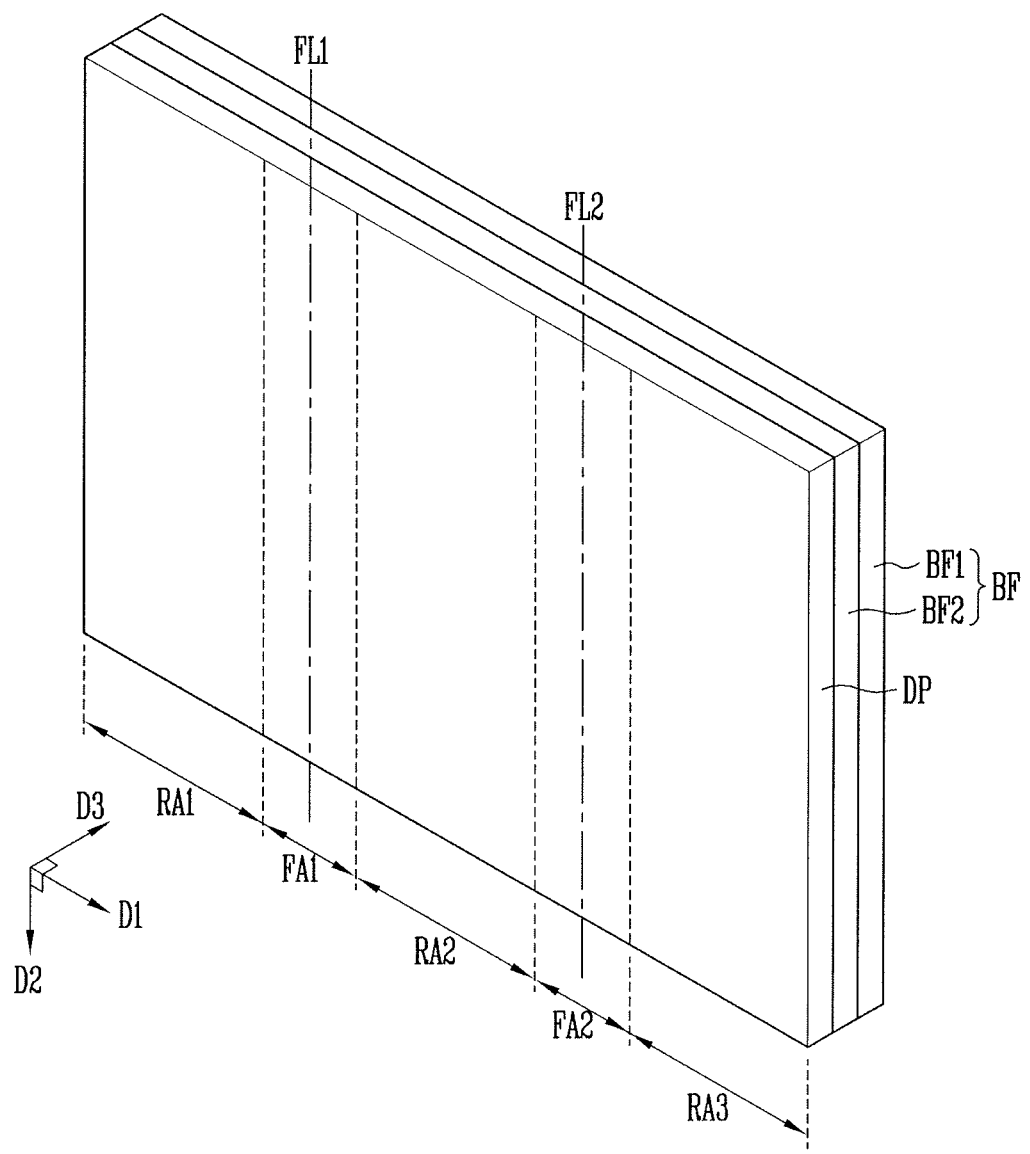
FIG. 12A illustrates a perspective view showing a display device according to an embodiment of the present disclosure.
Figure 12B:
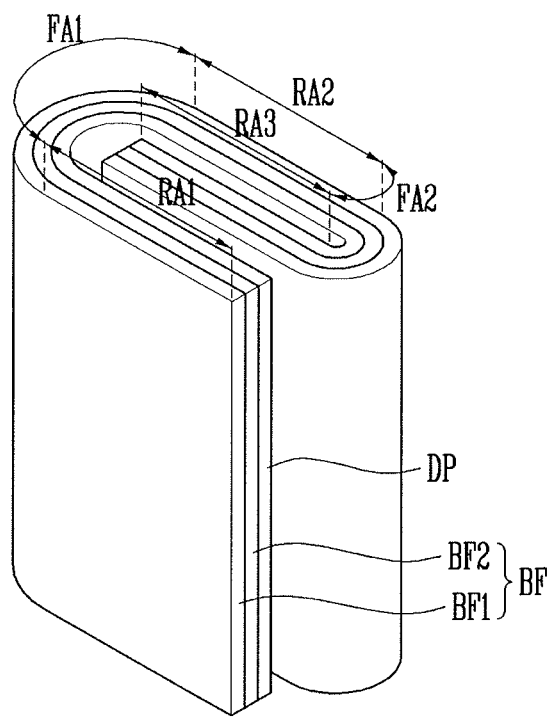
FIG. 12B illustrates a perspective view showing when the display device of FIG. 12A is folded.

FIG. 12A illustrates a perspective view showing a display device according to an embodiment of the present disclosure. FIG. 12B illustrates a perspective view showing when the display device of FIG. 12A is folded.

Referring to FIGS. 12A and 12B, a plurality of folding lines may be provided, and therefore, the display device may also include a plurality of foldable areas and a plurality of rigid areas. In this embodiment, a case where two folding lines, i.e., a first folding line FL1 and a second folding line FL2 are provided, and accordingly, a first rigid area RA1, a first foldable area FA1, a second rigid area RA2, a second foldable area FA2, and a third rigid area RA3 are sequentially disposed along a first direction D1 is disclosed as an example. The first foldable area FA1 and the second foldable area FA2 may extend along a second direction D2, corresponding to the first folding line FL1 and the second folding line FL2, respectively.

As shown in FIG. 12B, the display device may be folded in the first foldable area FA1 and the second foldable area FA2. In an implementation, the display device may be folded such that the third rigid area RA3 is located between the first rigid area RA1 and the second rigid area RA2. In an implementation, the display device may be folded such that the second rigid area RA2 is located between the first rigid area RA1 and the third rigid area RA3.

In an implementation, both of the first folding line FL1 and the second folding line FL2 may extend in the second direction D2. In an implementation, the first folding line FL1 and the second folding line FL2 may extend in directions different from each other. For example, the first folding line FL1 may extend in the first direction D1, and the second folding line FL2 may extend in the second direction D2. Alternatively, both of the first folding line FL1 and the second folding line FL2 may extend in the first direction D1. In an implementation, the first folding line FL1 may extend in the first direction D1, and the second folding line FL2 may extend in a direction obliquely with respect to the first folding line FL1. In an implementation, the same application may be made to a case where three folding lines are provided.

In an implementation, a foldable area may be provided at an outermost portion in one direction of the display device such that a portion of the display device may be rolled like a roll.

Figure 13A:
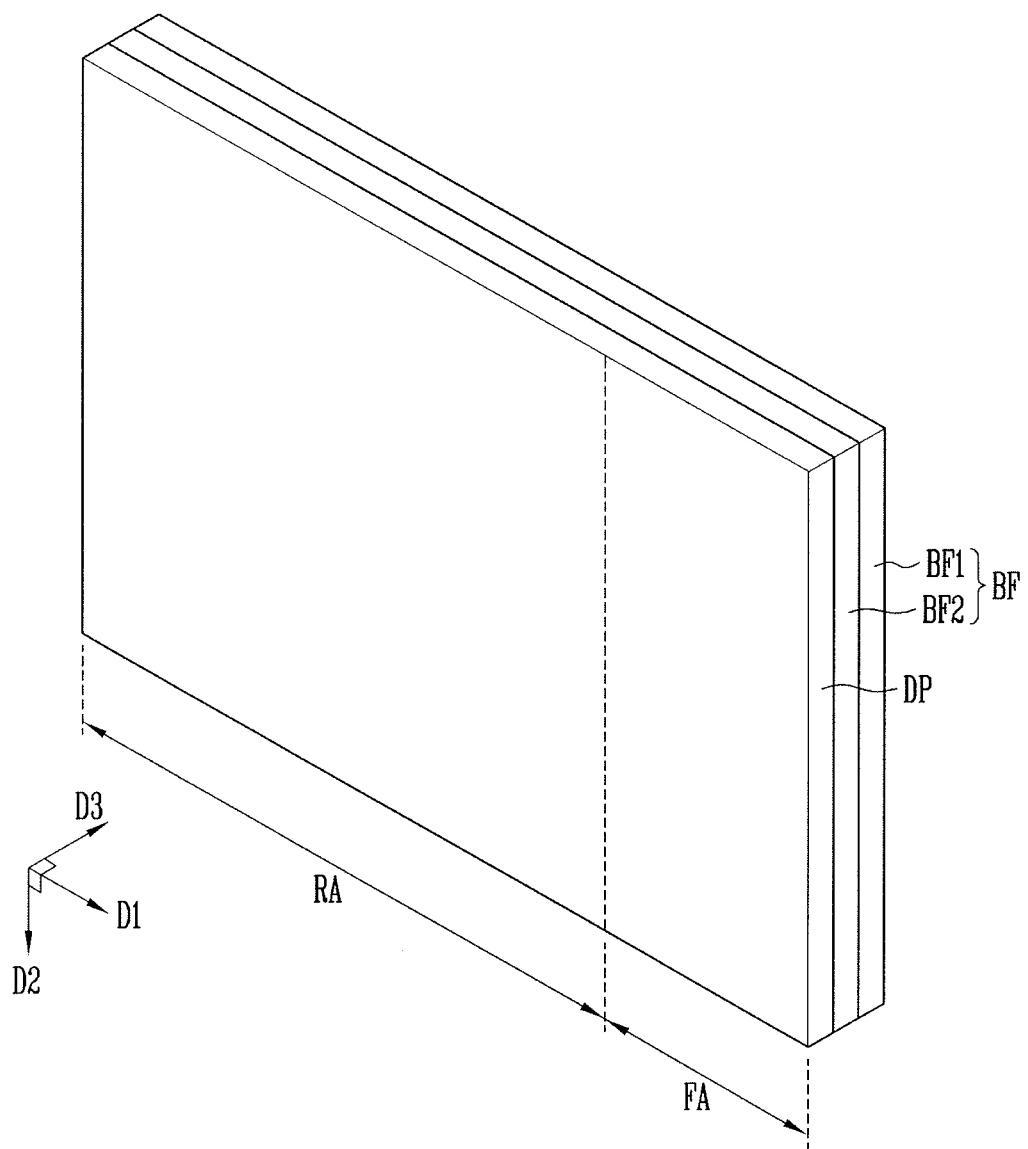
FIG. 13A illustrates a perspective view showing a display device according to an embodiment of the present disclosure.
Figure 13B:
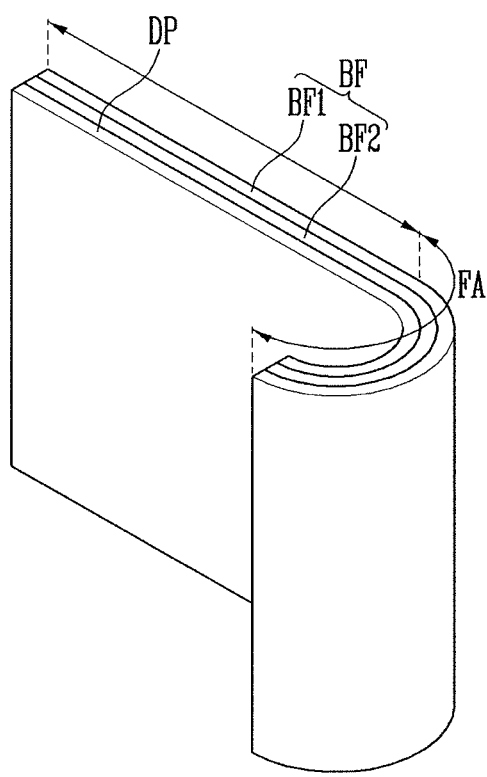
FIG. 13B illustrates a perspective view showing when the display device of FIG. 13A is rolled.

FIG. 13A illustrates a perspective view showing a display device according to an embodiment of the present disclosure. FIG. 13B illustrates a perspective view showing when the display device of FIG. 13A is rolled.

Referring to FIGS. 13A and 13B, the display device may include a rigid area RA and a foldable area FA. The foldable area FA may be provided at one side of the rigid area RA. The foldable area FA may be provided at an outermost portion of the display device in a first direction D1. The display device may be rolled in the foldable area FA.

By way of summation and review, if an external impact or stress is applied to a display device, a defect could occur in the display device, and therefore, the display quality of the display device could be deteriorated. Accordingly, a display device may be strong against external impact or stress.

The display device according to the embodiment of the present disclosure may be employed in various electronic devices. For example, the display device may be applied to televisions, notebook computers, cellular phones, smart phones, smart pads, PMPs, PDAs, navigations, various wearable devices such as smart watches.

According to the present disclosure, it is possible to provide a display device strong against external impact or stress.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
   a display panel that displays an image at a first surface thereof;
   a first member on a second surface of the display panel, the first member having a first density; and
   a second member between the display panel and the first member, the second member having a second density that is less than the first density,
   wherein the display panel includes:
      a foldable area in which the display panel is foldable; and
      a rigid area at one or more sides of the foldable area, and
   wherein the first member and the second member are disposed in at least a part of the foldable area.

2. The display device as claimed in claim 1, wherein the first member and the second member are buffer members that buffer impact applied to the display panel.

3. The display device as claimed in claim 1, wherein:
   the first density is about 0.7 g/cm$^3$ to about 0.9 g/cm$^3$, and
   the second density is about 0.3 g/cm$^3$ to about 0.5 g/cm$^3$.

4. The display device as claimed in claim 3, wherein:
   the first member has a thickness of about 60 μm to about 150 μm, and
   the second member has a thickness of about 60 μm to about 150 μm.

5. The display device as claimed in claim 4, wherein each of the first member and the second member has a thickness of about 100 μm.

6. The display device as claimed in claim 3, wherein the first member and the second member are made of a foam.

7. The display device as claimed in claim 4, wherein each of the first member and the second member independently include polystyrene, a polyolefin, a polyurethane, a polyamide, a synthetic rubber, polydimethylsiloxane, polybutadiene, polyisobutylene, poly(styrene-butadiene-styrene), polychloroprene, polyethylene, silicone, or a combination thereof.

8. The display device as claimed in claim 1, further comprising a support film between the first member and the second member.

9. The display device as claimed in claim 8, wherein the support film has a thickness of about 30 μm or less.

10. The display device as claimed in claim 1, further comprising an adhesive layer between the first member and the second member.

11. The display device as claimed in claim 1, wherein at least one of the first member and the second member has a variable thickness such that the thickness is different at different locations of the member.

12. The display device as claimed in claim 11, wherein at least one of the first member and the second member has a thickness in the foldable area that is smaller than a thickness thereof in the rigid area.

13. The display device as claimed in claim 1, wherein at least one of the first member and the second member has a variable density such that the density is different at different locations of the member.

14. The display device as claimed in claim 1, wherein at least one of the first member and the second member is provided in plurality.

15. The display device as claimed in claim 1, further comprising a third member between the second member and the display panel.

16. The display device as claimed in claim 1, wherein the display panel, the first member, and the second member have flexibility.

17. The display device as claimed in claim 1, further comprising a light shielding layer between the display panel and the second member.

18. The display device as claimed in claim 1, further comprising a heat dissipation layer on an outer surface of the first member.

19. The display device as claimed in claim 18, further comprising an electromagnetic wave shielding layer on an outer surface of the heat dissipation layer.

20. A display device, comprising:
a display panel that displays an image at a surface thereof;
a bending deformation buffer layer on another surface of the display panel; and
a compression and tensile deformation buffer layer between the display panel and the bending deformation buffer layer, the bending deformation buffer layer being different from the compression and tensile deformation buffer layer,
wherein the display panel includes:
a foldable area in which the display panel is foldable; and
a rigid area at one or more sides of the foldable area, and
wherein the bending deformation buffer layer and the compression and tensile deformation buffer layer are disposed in at least a part of the foldable area.

21. The display device as claimed in claim 20, wherein the bending deformation buffer layer has a density that is greater than a density of the compression and tensile deformation buffer layer.

22. The display device as claimed in claim 20, wherein:
the bending deformation buffer layer has a density of about 0.7 g/cm$^3$ to about 0.9 g/cm$^3$, and
the compression and tensile deformation buffer layer has a density of about 0.3 g/cm$^3$ to about 0.5 g/cm$^3$.

23. The display device as claimed in claim 20, wherein the bending deformation buffer layer and the compression and tensile deformation buffer layer each independently include polystyrene, a polyolefin, a polyurethane, a polyamide, a synthetic rubber, polydimethylsiloxane, polybutadiene, polyisobutylene, poly(styrene-butadiene-styrene), polychloroprene, polyethylene, silicone, or a combination thereof.

* * * * *